United States Patent [19]

Price

[11] 3,902,936

[45] Sept. 2, 1975

[54] GERMANIUM BONDED SILICON SUBSTRATE AND METHOD OF MANUFACTURE

[75] Inventor: James B. Price, Phoenix, Ariz.

[73] Assignee: Motorola, Inc., Chicago, Ill.

[22] Filed: Apr. 4, 1973

[21] Appl. No.: 347,969

[52] U.S. Cl. ........................ 156/3; 29/576; 29/580; 29/590; 148/178; 148/187; 148/184; 156/7; 156/8; 156/17; 357/69; 357/56; 357/49; 427/91; 427/93

[51] Int. Cl.².............. H01L 21/203; H01L 21/22; H01L 21/24

[58] Field of Search .......... 117/106 A, 229; 156/17, 156/7, 8, 3; 148/177, 179, 178, 184, 187; 29/576 J, 1 W, 582, 583, 580, 590; 317/235

[56] References Cited

UNITED STATES PATENTS

| | | | |
|---|---|---|---|
| 3,200,490 | 8/1965 | Clymer | 29/590 |
| 3,461,462 | 8/1969 | Ruggiero | 29/590 |
| 3,473,978 | 10/1969 | Jackson et al. | 117/106 A |
| 3,513,022 | 5/1970 | Casterline et al. | 156/17 |
| 3,544,856 | 12/1970 | Yonezu | 148/177 |
| 3,623,218 | 11/1971 | Mitarai et al. | 29/580 |
| 3,689,357 | 9/1972 | Jordan | 317/235 |
| 3,716,425 | 2/1973 | Davidsohn | 29/580 |
| 3,748,546 | 7/1973 | Allison | 317/235 |
| 3,755,012 | 8/1973 | George et al. | 29/580 |
| R26,778 | 3/1970 | Buie | 29/576 IW |

*Primary Examiner*—Douglas J. Drummond
*Assistant Examiner*—Jerome W. Massie
*Attorney, Agent, or Firm*—Vincent J. Rauner; Kenneth R. Stevens

[57] ABSTRACT

A support member is affixed to a silicon wafer, either patterned or not patterned, forming a substrate, by providing at least the wafer with a first layer of polycrystalline silicon, followed by a second layer of polycrystalline germanium. The support member may be provided with a first layer of polycrystalline silicon followed by a second layer of polycrystalline germanium. However, in the alternative, the support member may be provided with a layer of polycrystalline germanium directly after having properly prepared the surface to which the polycrystalline germanium is to adhere. The germanium layers are placed in contact with each other and heat is applied causing an alloying or an alloy interface between the polycrystalline germanium and the polycrystalline silicon to occur. The result is a silicon substrate, either patterned or unpatterned, in appropriate condition for formation of semiconductive devices and for the attachment of beam leads.

26 Claims, 9 Drawing Figures

GERMANIUM BONDED SILICON SUBSTRATE AND METHOD OF MANUFACTURE

BACKGROUND OF THE INVENTION

1. Field of the Invention

This invention relates to the manufacturing of semiconductive devices. More specifically it relates to those semiconductive devices that require a support member for handling purposes during the manufacturing process, including subsequent attachment of beam leads.

2. Description of the Prior Art

Typically, in dielectrically isolated integrated circuit processing, a support member is provided for a monocrystalline silicon wafer during the steps of manufacturing semiconductive devices on and/or in the wafer material. This has been done by depositing polycrystalline silicon on the monocrystalline silicon wafer to a thickness of 10 to 20 mils. This deposition process ordinarily takes approximately 2 hours at a temperature of 1150°C. This procedure provides the desired support member, but has several serious drawbacks. Ordinarily the wafer has been patterned and buried layers have been diffused therein. When the support member is formed, the temperature and time required are such that there is an out-diffusion or second diffusion of the buried layers. This undesirable out-diffusion must be considered in the original diffusion, requiring extremely precise control of the shape and also of the dopant concentration of the buried layer.

The support member is deposited on one side of the wafer, but commonly also forms on the edges of the wafer and ultimately around to the other side at the edges. These protrusions must be carefully removed.

The tendency for the polycrystalline silicon to be formed on the other side can lead to other complications. The wafer may become bonded to the supporting surface on which it rests during the deposition process. When the process is over and the apparatus is permitted to cool, the bonding often results in thermal stress, breaking the wafer.

The prior art yield is not as high as desired and therefore the cost per wafer is relatively high. Beam leads may be easily attached to the prior art substrate but does not result in an economically feasible product.

All of these undesirable features of the prior art are overcome by this invention described in detail below.

BRIEF SUMMARY OF THE INVENTION

In the preferred embodiment of this invention, a monocrystalline silicon wafer is patterned for dielectric isolation. The patterning is done in a well-known manner by etching grooves or moats in a desired configuration. Then a selected impurity is diffused into the areas defined by the grooves to form buried layers. A layer of silicon dioxide or silicon nitride is formed over the grooves and the areas defined by the grooves. These steps are all known prior art. If beam leads are to be attached, the areas defined by the grooves are typically separated as a final step. Therefore, these areas may well vary in shape and size from those of the dielectrically isolated circuit arrangement.

In the preferred embodiment, the support member is a monocrystalline silicon wafer which is unacceptable for the formation of semiconductive devices therein. The patterned wafer is provided with a very thin layer of polycrystalline silicon which is deposited at a temperature in the order of 1100°C for five minutes. The result is a film of approximately 10 microns in thickness with virtually no disturbance of the buried layers. This same procedure may be used on the reject wafer or, the surface of the reject wafer may be textured by sawing or lapping, and no layer of polycrystalline silicon formed. Over the polycrystalline silicon film formed on the wafer, a polycrystalline germanium leyer, in the order of 10 microns in thickness is formed. This is also done in the case of the reject wafer when a polycrystalline silicon film has been formed. It has been found that a polycrystalline germanium layer may also be formed over a textured surface of the reject wafer when circumstances make that procedure economically desirable. The polycrystalline germanium layers are placed in contact with each other and heat is applied at a temperature of approximately 1100°C for approximately 20 minutes. The result is a substrate including a monocrystalline silicon wafer that has been patterned and supplied with a support member without causing extensive out-diffusion of the buried layers that had been earlier diffused into the wafer. Also, there are no protrusions on the other side of the wafer to cause breakage, as described above. Furthermore, there is no costly handling of the wafer required to remove the protrusions that are formed by a long process of growing a support member.

If the areas defined by the grooves are to be provided with beam leads and separated, semiconductive devices are formed in the respective areas and a silicon dioxide layer is formed over the areas, patterned to permit electrical contact at desired locations. Typically, a thin conductive film is deposited first, and then the beam leads are selectively electro-plated over the thin conductive film according to a pattern formed on the film, thereby forming beam leads of substantial thickness. The thin film is etched away leaving the beam leads also etched, but at a desired thickness. A mask, typically of wax, is placed over the beam leads and supporting surface and then the support member is etched away leaving only the areas defined by the grooves and the beam leads attached to those areas. The wax mask may be removed by a known method of heating and cleansing with alcohol. This step of separation could also be accomplished by other techniques such as by scribing between the areas defined by the grooves.

It is an object of this invention, therefore, to produce a dielectrically isolated circuit substrate at a high yield rate from the manufacturing process.

Another object of this invention is to provide a substrate having beam leads for electrical connection at a high yield rate.

It is another object to produce a substrate having a support member that is a reject monocrystalline wafer.

It is still another object to produce a dielectric isolation substrate having buried layers which are relatively undisturbed by the process of attaching the support member.

A further object is to provide a dielectric isolation substrate having beam leads for electrical connection.

These and other objects will become apparent in the detailed description that follows.

DETAILED DESCRIPTION OF THE INVENTION

Figure 1:
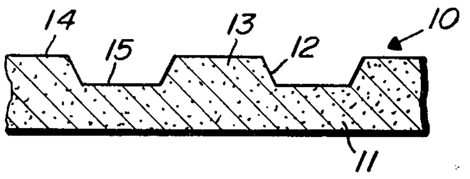
FIGS. 1 and 2 illustrate prior art steps of patterning a monocrystalline silicon wafer.

FIG. 1 illustrates a monocrystalline silicon wafer 10 having a body 11 with grooves 12 having bottom surfaces 15. Grooves 12 are etched in from surface 14 leaving isolated areas 13.

Figure 2:
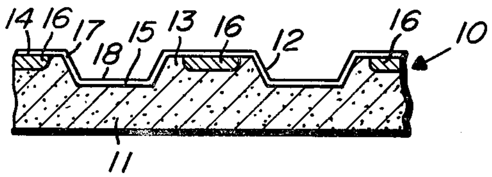

FIG. 2 shows the wafer 10 having had other prior art steps performed on it. Buried layers 16 have been diffused into the isolated areas 13 and a layer of silicon dioxide 17 has been formed over the surfaces 14 and 15.

Figure 3:
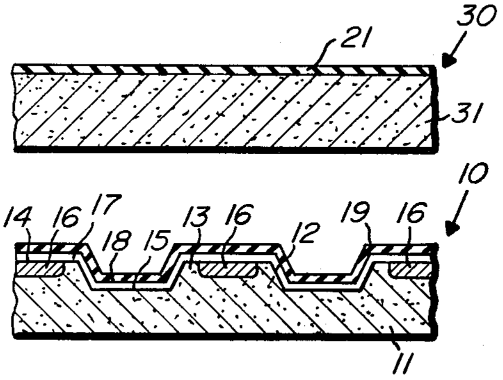
FIG. 3 illustrates a further step in the inventive process including processing a support member.

FIG. 3 shows a layer 19 of polycrystalline silicon having been formed over silicon dioxide layer 17. Also illustrated is a support member 30 (a reject monocrystalline silicon wafer in the preferred embodiment) having a layer of polycrystalline silicon 21 applied to the body 31. Not shown is a reject monocrystalline silicon wafer that has not had a layer of polycrystalline silicon applied to the body 31. The surface of body 31 has simply been textured so that a subsequent step of depositing a layer of polycrystalline germanium is possible. These layers 19 and 21 are deposited at a temperature of approximately 1100°C for 5 minutes, providing a thickness of approximately 10 microns.

Figure 4:
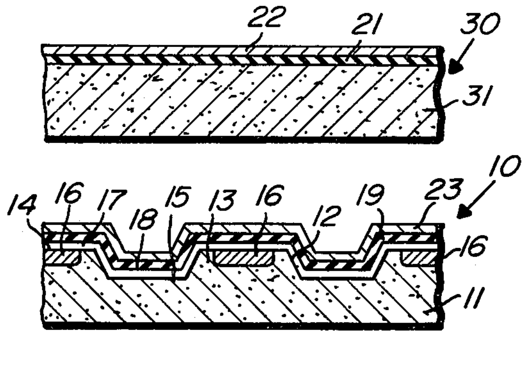
FIGS. 4, 5 and 6 illustrate subsequent steps of the inventive process.

FIG. 4 shows still another layer 23 of polycrystalline germanium having been deposited over layer 19 of the wafer 10. A layer of polycrystalline germanium 22 is shown deposited over layer 21 of reject wafer 30. As indicated above, the layer of polycrystalline germanium 22 may alternately be deposited directly over reject wafer 30 if the top surface of reject wafer 30 has been properly prepared. Layers 22 and 23 are deposited at a temperature of approximately 810°C as measured by an optical pyrometer for 50 minutes, providing a thickness of approximately 10 microns.

Figure 5:
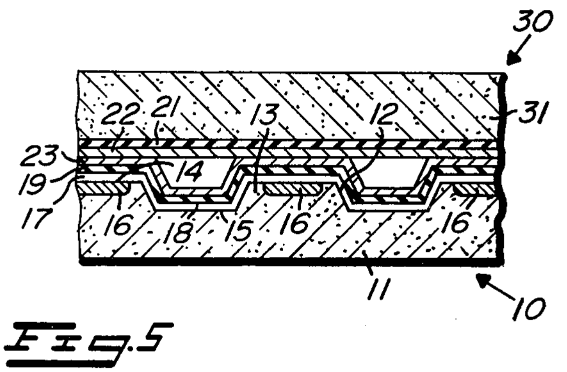

FIG. 5 illustrates reject wafer 30 having been turned over so that polycrystalline germanium layers 22 and 23 are in contact.

Figure 6:
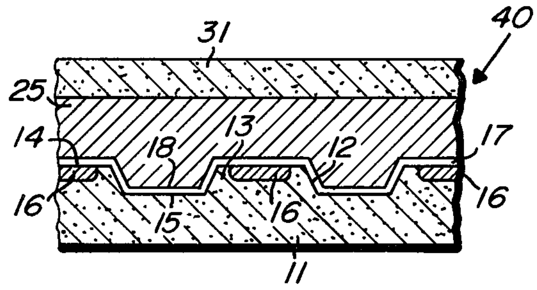

FIG. 6 illustrates reject wafer 30 and wafer 10 having been alloyed to form substrate 40. In the preferred embodiment, this alloying process is one of heating the contacting wafers up to a temperature of approximately 1100°C as measured by an optical pyrometer and maintaining that temperature for approximately 20 minutes. This step is done in the absence of oxygen. Oxygen may be excluded by performing this step in a vacuum, in a reducing atmosphere such as a hydrogen atmosphere, or in an inert atmosphere such as an argon atmosphere. Of course, the addition of pressure is contemplated by this invention, such pressure reducing the heating temperature. The resultant structure shows an alloy area 25 which is comprised of layers 19, 21, 22 and 23 as well as part of the reject wafer body 31.

Figure 7:
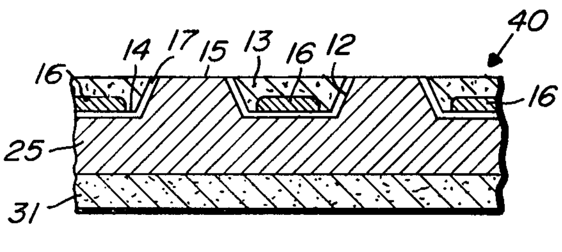
FIG. 7 illustrates the substrate ready for subsequent steps of forming semiconductive devices.

FIG. 7 shows the completed substrate 40 having been turned over and having had body 11 shaped back to expose mesa isolated areas 13 having buried layers 16 for any desired subsequent steps of forming semiconductive devices and beam leads.

Figure 8:
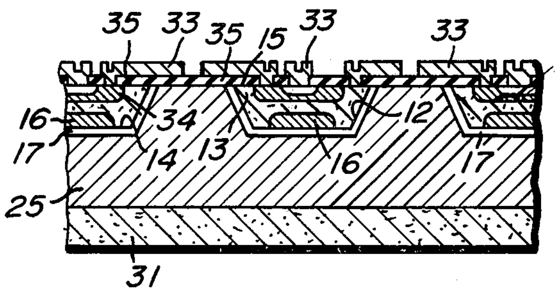
FIG. 8 illustrates the substrate having had semiconductive devices formed therein and having had beam leads deposited thereon.

FIG. 8 illustrates conventional semiconductive devices 34 having been formed in isolated areas 13. The formation of these devices is well known. Also shown are beam leads 33 electrically connected to semiconductive devices 34 at prescribed points and insulated therefrom at all other areas by dielectric layer 35 which may be silicon dioxide. In a well known manner, a thin conductive film is deposited over the entire surface and patterned in a known manner providing circuit paths for the subsequent electro plating of beam leads. The thin film is then etched away leaving beam leads 33 etched to the extent necessary for etching away the thin film, but leaving a desired thickness of beam lead. It should be understood that this is a preferred technique but the formation of beam leads is certainly not confined to the process described. For example, and electroless plating technique could be used or a vacuum deposition technique could be used.

Figure 9:
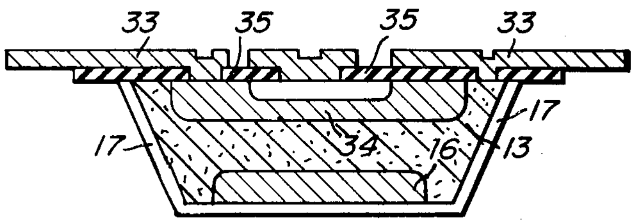
FIG. 9 illustrates a discrete area having at least one device formed therein with beam leads attached thereto, after having been separated from all other discrete areas.

FIG. 9 illustrates an isolated area 13 having been separated from all other isolated areas after the formation of beam leads 33 described above. This step is accomplished by masking the surface having the beam leads 33 with wax and then etching away all of the material until silicon dioxide layer 17 is reached. The wax is removed by heating and then cleaning the surface and the beam leads 33 with alcohol. The isolated areas are then easily separable being connected only by dielectric layer 35.

The preferred embodiment involves dielectrically isolated devices, but the technique is appropriate to any device that requires a support member for proper handling during the necessary procedure for forming semiconductive devices. Therefore, it is not necessary that the patterning steps 1 and 2 shown above be performed. Also, a reject wafer is not a limitation of this invention. Certainly any support member comprised of polycrystalline silicon would be appropriate as would be such materials as silicon carbide, aluminum oxide, or any other material that has a melting point as high as silicon and whose coefficient of expansion is approximately the same as that of monocrystalline silicon. It should also be understood that the temperatures and times noted above are simply illustrative. Longer times at lower temperatures may yield like results, as empirically determined.

I claim:

1. A process of attaching a support member to a monocrystalline silicon wafer, the support member having a coefficient of thermal expansion and a melting point approximately equal to the coefficient of thermal expansion and the melting point, respectfully, of monocrystalline silicon, comprising the steps of:

a. forming a protective layer on the wafer;

b. forming a first thin layer of polycrystalline silicon over the protective layer;

c. forming a second and third thin layer of polycrystalline germanium over the thin layer of polycrystalline silicon and over said support member, respectively;

d. contacting said second thin layer of polycrystalline germanium with said third thin layer of polycrystalline germanium;

e. applying heat for forming an alloy interface for joining the wafer to the support member.

2. The process of claim 1 comprising the step of:

a. forming a fourth thin layer of polycrystalline silicon over the support member before forming said third thin layer of polycrystalline germanium over the support member.

3. The process of claim 1 comprising the step of:

a. texturing the surface of the support member before forming said third thin layer of polycrystalline germanium over the support member.

4. The process of claim 1 wherein:

a. the support member is monocrystalline silicon and the protective layer is silicon dioxide.

5. The process of claim 1 wherein:

a. the support member is monocrystalline silicon and the protective layer is silicon nitride.

6. The process of claim 1 wherein wafer is patterned prior to forming the protective layer on the wafer comprising the steps of:

a. etching grooves in the wafer to define discrete areas;

b. forming a first protective layer within the grooves and around the discrete area;

c. diffusing a selected impurity into the discrete areas to form buried layers therein.

7. The process of claim 2 wherein the wafer is patterned prior to forming the protective layer on said wafer comprising the steps of:

a. etching grooves in the wafer to define discrete areas;

b. forming a first protective layer within the grooves and around the discrete area;

c. diffusing a selected impurity into the discrete areas to form buried layers therein.

8. The process of claim 3 wherein the wafer is patterned prior to forming the protective layer on the wafer, comprising the steps of:

a. etching grooves in the wafer to define discrete areas;

b. forming a first protective layer within the grooves and around the discrete area;

c. diffusing a selected impurity into the discrete areas to form buried layers therein.

9. The process of claim 6 further comprising the steps of:

a. forming semiconductor devices in the discrete areas after joining the wafer to the support member;

b. forming beam leads over the first protective layer to make electrical contact to a semiconductor devices; and c. etching away the support member and said alloy interface leaving only the wafer, said semiconductive devices and said beam leads.

10. The process of claim 7 further comprising the steps of:

a. forming semiconductor devices in the discrete areas after joining the wafer to the support member;

b. forming beam leads over the first protective layer to make electrical contact to a semiconductor device; and c. etching away the support member and said alloy interface leaving only the wafer, said semiconductive devices and said beam leads.

11. The process of claim 8 further comprising the steps of:

a. forming semiconductor devices in the discrete areas after joining the wafer to the support member;

b. forming beam leads over the first protective layer to make electrical contact to a semiconductor device; and c. etching away the support member and said alloy interface leaving only the wafer, said semiconductive devices and said beam leads.

12. The process of claim 9 wherein the step of forming the alloy interface further comprises the step of:

a. elevating the temperature above the melting point of germanium and below the melting point of silicon.

13. The process of claim 9 comprising the step of:

a. forming said alloy interface in a vacuum.

14. The process of claim 9 comprising the step of:

a. forming said alloy interface in a reducing atmosphere.

15. The process of claim 9 comprising the step of:

a. forming said alloy interface in an inert atmosphere.

16. The process of claim 10 wherein the step of forming the alloy interface further comprises the steps of:

a. elevating the temperature above the melting point of germanium and below the melting point of silicon.

17. The process of claim 10 comprising the step of:

a. forming said alloy interface in a vacuum.

18. The process of claim 10 comprising the step of:

a. forming said alloy interface in a reducing atmosphere.

19. The process of claim 10 comprising the step of:

a. forming said alloy interface in an inert atmosphere.

20. The process of claim 11 wherein the step of forming the alloy interface further comprises the step of:

a. elevating the temperature above the melting point of germanium and below the melting point of silicon.

21. The process of claim 11 comprising the step of:

a. forming said alloy interface in a vacuum.

22. The process of claim 11 comprising the step of:

a. forming the alloy interface in a reducing atmosphere.

23. The process of claim 11 comprising the step of:

a. forming said alloy interface in an inert atmosphere.

24. The process of claim 9 comprising the step of:

a. applying sufficient heat and pressure for forming said alloy interface.

25. The process of claim 10 comprising the step of:

a. applying sufficient heat and pressure for forming said alloy interface.

26. The process of claim 11 comprising the step of:

a. applying sufficient heat and pressure for forming said alloy interface.

* * * * *